United States Patent [19]

Ducourant

[11] Patent Number: 5,023,475
[45] Date of Patent: Jun. 11, 1991

[54] IC D-TYPE MASTER/SLAVE FLIP-FLOP

[75] Inventor: Thierry Ducourant, Crosne, France

[73] Assignee: U.S. Philips Corporation, New York, N.Y.

[21] Appl. No.: 367,522

[22] Filed: Jun. 16, 1989

[30] Foreign Application Priority Data

Jun. 17, 1988 [FR] France ................. 88 08148

[51] Int. Cl.$^5$ .................. H03K 3/284; H03K 3/26
[52] U.S. Cl. ............................... 307/272.2; 307/279; 307/261
[58] Field of Search ............... 307/272.2, 352, 362, 307/279, 350, 261; 341/141, 155

[56] References Cited

U.S. PATENT DOCUMENTS

| 4,004,158 | 1/1977 | Morgan | 307/362 |
|---|---|---|---|
| 4,316,185 | 2/1982 | Watrous et al. | 307/362 |
| 4,649,293 | 3/1987 | Ducourant | 307/272.2 |
| 4,656,371 | 4/1987 | Binet et al. | 307/272.2 |
| 4,689,497 | 8/1987 | Umeki et al. | 307/272.2 |
| 4,777,388 | 10/1988 | Widener | 307/272.2 |
| 4,779,009 | 10/1988 | Tsunoi et al. | 307/272.2 |
| 4,900,949 | 2/1990 | Saitoh | 307/272.2 |

Primary Examiner—Stanley D. Miller
Assistant Examiner—Richard Roseen
Attorney, Agent, or Firm—Bernard Franzblau

[57] ABSTRACT

An integrated circuit, D-type master-slave flipflop includes a bistable master element connected between two supply voltage terminals and having a first data input for receiving data. A control means is provided having a control signal input for erasing or writing into the master element under the control of a control signal. A bistable slave element is connected between the two supply voltage terminals and has a second data input connected to a data output of the master element. The slave element is directly controlled by signals on the second data input for enabling writing into the slave element after an output signal at the master element data output reaches a predetermined voltage level.

12 Claims, 3 Drawing Sheets

IC D-TYPE MASTER/SLAVE FLIP-FLOP

BACKGROUND OF THE INVENTION

This invention relates to an integrated circuit, comprising a D-type master/slave flipflop comprising:

a bistable master element connected between two supply voltage terminals and having a first data input for receiving data, control means having a control signal input for erasing or enabling writing into the master element under control of a control signal;

a bistable slave element connected between two supply terminals and having a second data input connected to a data output of said master element.

The invention is used, for example, a comparator which is part of an analog-to-digital converter which is referred to as a parallel converter in which an analog input signal is applied to the inputs of several parallel comparator circuits in order to obtain a digital output signal. The input voltage is compared in said circuits with a reference voltage which differs for each comparator circuit. The output signals of the comparator circuits are converted into a digital output signal by means of a decoding device. Analog converters often comprise a flip-flop as described above.

A circuit of this kind is known, inter alia from European Patent Application No. 85 20 1742.5, which corresponds to U.S. Pat. No. 4,649,293 (3/10/87).

The cited U.S. Pat. No. describes a clocked voltage comparator which comprises a Delay-type master/slave flip-flop. The clocked comparator comprises:

an acquisition or comparison stage which serves to compare an analog input voltage ($V_{IN}$) with an analog reference voltage ($V_{REF}$) and to supply the result of said comparison as an intermediate signal ($V_M$) and its complement ($\overline{V_M}$). An amplifier stage amplifies the logic states of the intermediate signal. A first and a second latching stage are coupled to the comparison stage and the amplifier stage, respectively, for generating and storing the logic states determined by the signals from the comparison stage and the amplifier stage. Each latching stage comprises a differential transistor pair having a common terminal connected to ground. A further differential transistor pair is arranged in parallel with the last-mentioned transistor pair and is controlled by a clock signal C for the first latching stage and by its complement $\overline{C}$ for the second latching stage. The comparison stage and the amplifier stage are also controlled by the clock signal C and the latching stages are each coupled to the comparison stage and the amplifier stage, respectively, by means of load resistors.

The known comparator operates in two periods. In a first period acquisition of the information by the first differential pair takes place. This acquisition is effected at the drain of the transistors of the first differential pair of the first latching stage when the clock or control signal is high.

At that instant the output signals of the memory stage, being available at the gate electrodes of the transistors of the bistable circuit and forming the output signals of the comparator, appear as signals whose states are both nearly zero. Former information available at the gate electrodes is erased.

During a second period, when the clock or control signal becomes low or zero again, the decision and storage function is performed, i.e. the signals which are available at the gate electrodes of the bistable circuit and which were previously both nearly zero then become complementary.

Thus, each time when the clock signal is high, the output signals of the comparator are erased and both become approximately zero and at that time these output signals do not furnish information. This is a problem in applications where this information is needed at any moment.

It is known from the state of the art, i.e. from the cited U.S. patent, that this problem can be solved by utilizing a master-slave structure, i.e. by associating two comparators in the way that has been set forth hereinabove. This structure enables the storage of the information during the acquisition phases.

However, this known structure necessitates the use of a large number of components, which is a drawback when large scale integration is desired. On the other hand, this solution also necessitates the use of a complementary clock signal which is always difficult to realize when a strictly complementary signal is to be obtained.

SUMMARY OF THE INVENTION

The present invention proposes a circuit which enables the storage of the information while avoiding the drawbacks of the known master/slave system.

In accordance with the invention, this object is achieved by means of a circuit as defined in the introductory paragraph above by providing means for controlling the slave element by means of an input signal at said second data input alone and for simultaneously writing into the slave element when the input signal at said second data input has reached a predetermined voltage level.

An embodiment in accordance with the invention includes an integrated circuit in which the master element comprises two cross-coupled inverters, each of which is connected between the two supply voltage terminals and comprises a respective first load and a respective first driver transistor. The slave element comprises two cross-coupled inverters, each of which is connected between the two supply voltage terminals and comprises a respective second load and a respective second driver transistor. The control means comprise two control transistors, each of which has a channel disposed in parallel to a channel of the respective first driver transistor and a control electrode for receiving the control signal. The circuit is characterized in that the means for controlling the slave element comprises two coupling transistors, each of which has a channel disposed parallel to a channel of the respective second driver transistor and a control electrode, which is a data input terminal, coupled to a respective data output terminal of the master element.

The circuit in accordance with the invention thus offers, inter alia, the following advantages:
it comprises relatively few components,
it operates by means of a single clock signal of high frequency,
it has a low power consumption,
it enables output signals to be obtained which save, upon each change-over of the state of a control signal, the information acquired during the preceding state.

BRIEF DESCRIPTION OF THE DRAWINGS

The invention will be described in detail hereinafter, by way of example, with reference to the accompanying drawings; in which.

DESCRIPTION OF THE PREFERRED EMBODIMENTS

Figure 1:
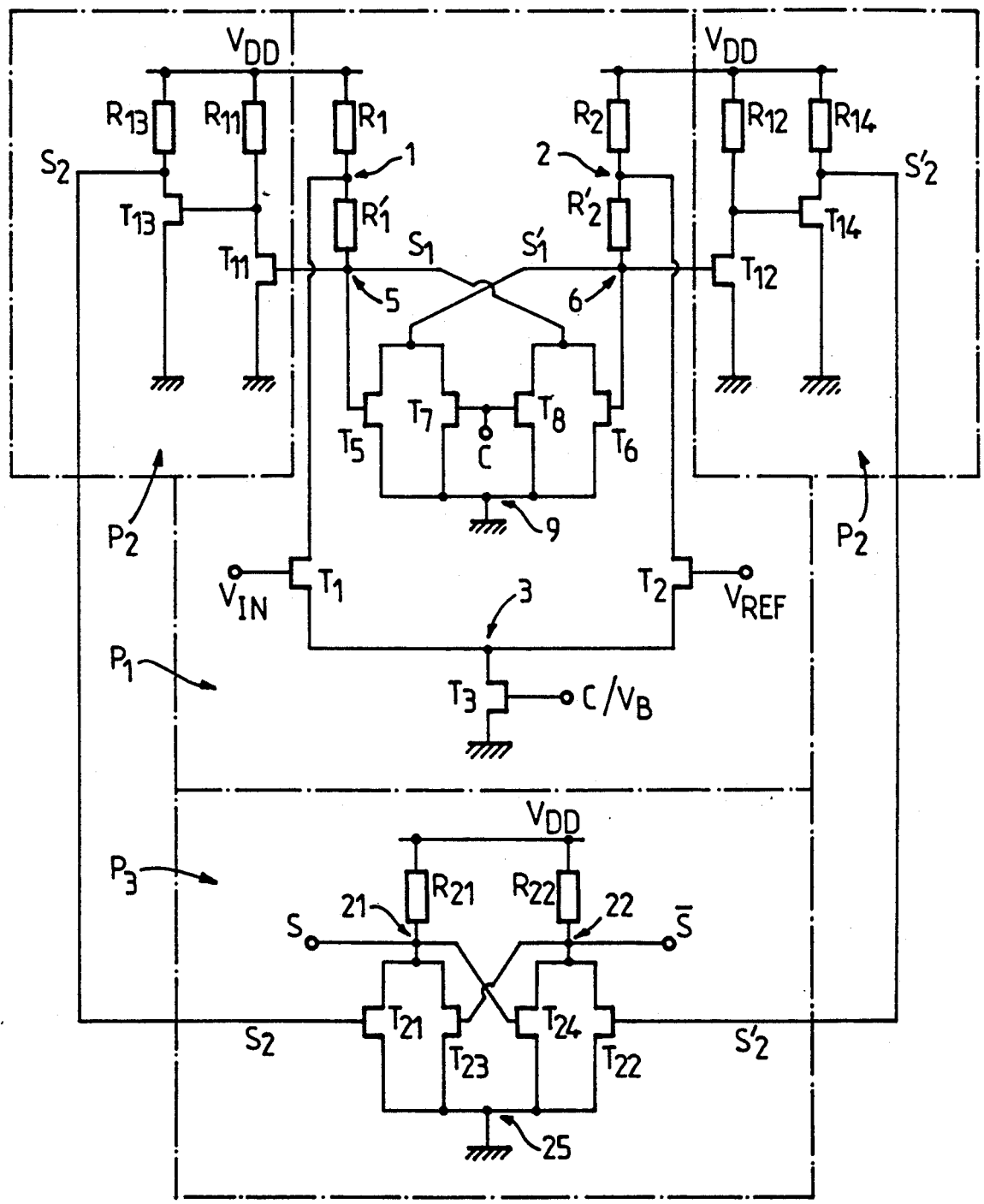
FIG. 1 diagrammatically shows an example of the circuit in accordance with the invention.

As appears from FIG. 1, the example of the circuit in accordance with the invention comprises three parts $P_1$, $P_2$, $P_3$ which cooperate in order to obtain the desired result, enabling signals to be obtained at the output which save, upon each change-over of the state of a control signal, the information acquired during the preceding state.

In the embodiment of the invention which is shown in FIG. 1, the synchronized comparator is preferably realized by way of enhancement-type field effect transistors which are made, for example, in gallium arsenide; because their pinch-off voltage $V_T > 0$, they are normally pinched off in the absence of a gate-source signal.

The first part $P_1$ of the circuit shown in FIG. 1 is a comparator circuit which is formed by an acquisition stage followed by a memory stage. The memory stage is a D-type flip-flop which forms the master element of the circuit.

The acquisition stage is formed in known manner by two field effect transistors $T_1$ and $T_2$ which are coupled by way of their sources in order to form a first differential pair. The sources coupled to the node 3 are connected to the drain of a transistor $T_3$ which is connected as a current source. This transistor $T_3$, whose source electrode is connected to ground, is controlled either by a clock signal C or by a d.c. supply voltage $V_B$.

The gate electrode of one of the transistors of the acquisition stage, for example, the transistor $T_1$, receives the analog signal $V_{IN}$ which is to be compared with the reference signal $V_{REF}$ which is applied to the gate electrode of the second transistor $T_2$ of the first differential pair.

The drains of the transistors $T_1$ and $T_2$ of the acquisition stage are connected to a d.c. supply voltage $V_{DD}$ via loads $R_1$ and $R_2$, respectively, which may be, for example, resistive loads.

In order to form a bistable circuit, the memory stage is formed, first of all by a second differential pair of driver transistors $T_5$ and $T_6$ which are coupled by way of their sources and which are connected directly to ground at the node 9.

The gate electrodes of the transistors $T_5$ and $T_6$ of this second differential pair, i.e. nodes 5 and 6, respectively, receive, via resistive loads $R'_1$ and $R'_2$, respectively, the drain signals of the transistors $T_1$ and $T_2$, respectively, of the first differential pair.

The gate electrode of each of the transistors $T_5$ and $T_6$ is cross-wise coupled to the drain of the other transistor T6 and T5 of the second differential pair. This second differential pair, with their respective loads, forms the D-type flip-flop (master element). The master element thus includes two cross-coupled inverters $T_5$, $T_6$.

The memory stage is controlled by means of two transistors $T_7$ and $T_8$ which are connected parallel to the transistors $T_5$ and $T_6$, respectively, of the second differential pair, thus forming a third differential pair. The transistors $T_7$ and $T_8$ of the third differential pair are controlled by the clock signal C. The common sources are connected to ground at the node 9.

When the clock signal C becomes high, with field effect transistors of the enhancement type, the acquisition stage is activated because the current source transistor $T_3$ becomes conductive (in this case this transistor is controlled by the clock signal C).

Because the memory stage is controlled by the clock signal C, as soon as the clock signal becomes high the two output signals of the memory stage, $S_1$ and $S'_1$, which are available at the nodes 5 and 6, respectively, simultaneously become zero, more exactly, they assume a state in the vicinity of zero because of the difference existing between the signals $V_{IN}$ and $V_{REF}$. Consequently, the output of the memory stage no longer bears a relationship to the relative values of $V_{IN}$ and $V_{REF}$ and the memory stage is erased.

This de-activation of the memory stage at the instant at which the acquisition stage is activated prevents the occurrence of instabilities which would occur if the acquisition stage and the memory stage were controlled by different clock signals, for example by complementary clock signals, as is the case in U.S. Pat. No. 4,649,293.

This result is obtained because of the fact that the control of the memory stage is imposed by means of the third differential pair $T_7$, $T_8$. The same result is obtained if the acquisition stage is continuously active, i.e. when the current source transistor is fed by a d.c. voltage $V_B$ and hence is continuously conductive.

The second part of the circuit $P_2$ of FIG. 1 consists of two stages for modifying the output signals $S_1$ and $S'_1$ of the memory stage, each of said stages treating a respective one of the signals $S_1$ or $S'_1$.

As has already been stated, when the clock signal is high and the comparator operates in the acquisition period, the output signals $S_1$ and $S'_1$ of the memory stage have a state which is only approximately zero and not exactly zero.

Each stage for modifying the signals comprises:

a transistor which is connected as an inverter, $T_{11}$ and $T_{12}$ respectively, whose drain is connected to the d.c. supply $V_{DD}$ via a load, for example, a resistive load $R_{11}$ and $R_{12}$, respectively, and whose source is connected to ground, followed by a second transistor which is connected as an inverter, $T_{13}$ and $T_{14}$, respectively, whose drain is connected to the d.c. supply voltage $V_{DD}$ via a load, for example, a resistive load $R_{13}$ and $R_{14}$, respectively, and whose source is connected to ground.

The output signals $S_1$ and $S'_1$ of the memory stage are applied to the gate electrodes of the first inverter transistors $T_{11}$, $T_{12}$. The output signals of the first inverter transistors are applied to the gate electrodes of the second inverter transistors $T_{13}$, $T_{14}$, and the output signals $S_2$ and $S'_2$ form the modified output signals of the memory stage. Actually, the proportioning and the conductivity type of the transistors of this part $P_2$ are such that when the output signals $S_1$ and $S'_1$ of the memory stage have a state near zero, the output signals $S_2$ and $S'_2$ have a state which is exactly zero.

As has already been stated, in order to avoid the loss of information due to the fact that the two output signals of the memory stage simultaneously become zero during the acquisition phase, the signals $S_2$ and $S'_2$ supplied by the part $P_2$ are applied to the inputs of the part $P_3$, which makes up the slave element of the circuit.

This part P3 constitutes a flipflop of the R-S type. It is formed by a first pair of parallel-connected transistor $T_{21}$ and $T_{23}$ whose coupled drains are connected to the d.c. power supply voltage $V_{DD}$ via a load, for example, a resistive load $R_{21}$, and whose sources are connected to ground, and by a second pair of parallel-connected transistors $T_{22}$, $T_{24}$ whose coupled drains are connected to the d.c. power supply voltage $V_{DD}$ via another load, for example a resistive load $R_{22}$, and whose sources are connected to ground. The gate electrodes of one of the transistors of each pair, i.e. $T_{21}$ and $T_{22}$, respectively, receive the signals supplied by the part $P_2$, i.e. $S_2$ and $S'_2$. The gate electrodes of the second transistor of each pair are cross-wise coupled to the common drain of the other pair. The cross coupled transistors $T_{23}$ and $T_{24}$ together with the resistive loads $R_{21}$ and $R_{22}$ form a pair of coupled inverters and act as the slave element in the master/slave circuit.

Figure 2:
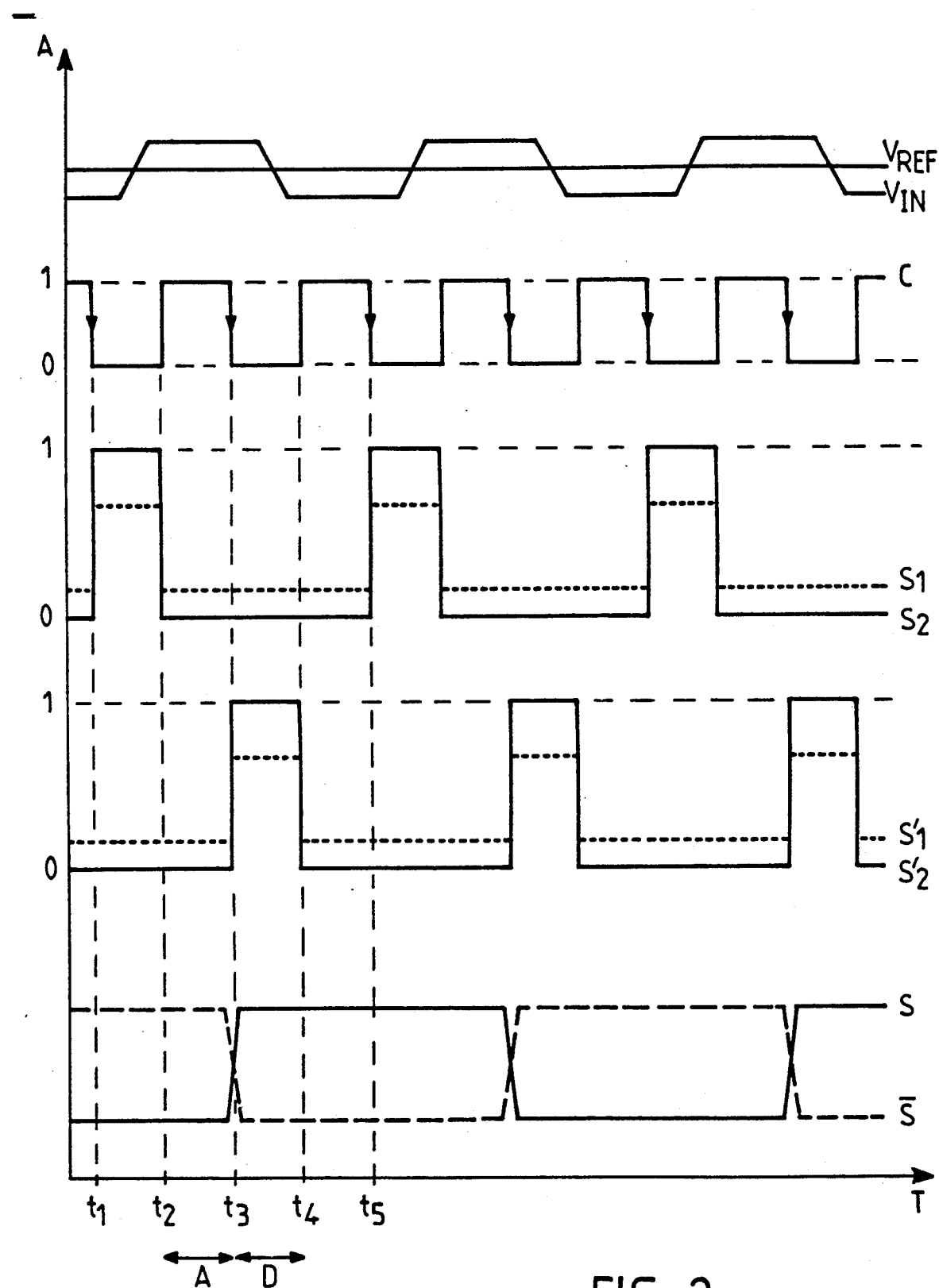
FIG. 2 provides waveforms which illustrate the sequencing of the signals occurring in the circuit shown in FIG. 1.

As appears from FIG. 2, it is thus ensured that the state assumed by the signals $S_2$ and $S'_2$ during the decision period corresponding to the low state of the clock signal C is saved and hence memorized by the output signals S and $\bar{S}$ of the R-S flipflop.

FIG. 2 illustrates the sequencing of the signals in the circuit and shows first of all the input signals $V_{IN}$ and $V_{REF}$. It also shows the clock signal C whose high states correspond to the acquisition phase A and whose low states correspond to the decision phase D. It shows that the signal $S_1$ becomes low at the instant $t_1$ at the start of an acquisition phase, the signal $S'_1$ also being low, after which the signal $S'_1$ becomes high at the instant $t_2$ at the start of the decision phase D, the difference between the input signals $V_{IN}$ and $V_{REF}$ being positive. At the instant $t_3$ at the start of the next acquisition phase the information in the master element is erased and both signals $S_1$ and $S'_1$ again becomes low. At the start of the next decision phase at $t_4$ the signal $S_1$ becomes high, the difference between the signals $V_{IN}$ and $V_{REF}$ being negative, etc.

The signals $S_2$ and $S'_2$ follow the same diagram at the same instants, but in the low state they are both exactly zero.

At the instant $t_5$ the situation at the instant $t_1$ occurs again and at the instant $t_6$ the situation at the instant $t_2$ occurs. At the start of the first decision phase at $t_2$, the states of the signals S and $\bar{S}$ are reversed and these signals then keep their states until the instant $t_4$ where they are reversed again. Thus, they always remain complementary and are reversed only at the start of a decision phase when the sign of the difference between $V_{IN}$ and $V_{REF}$ changes. The information of the preceding state is thus memorized.

The output signals S and $\bar{S}$ of the R-S flipflop of the part $P_3$ constitute the digital output signals of the comparator in accordance with the invention.

The phase of the output signal S follows the sign of the difference between the input signal $V_{IN}$ and the reference signal $V_{REF}$.

Figure 3:
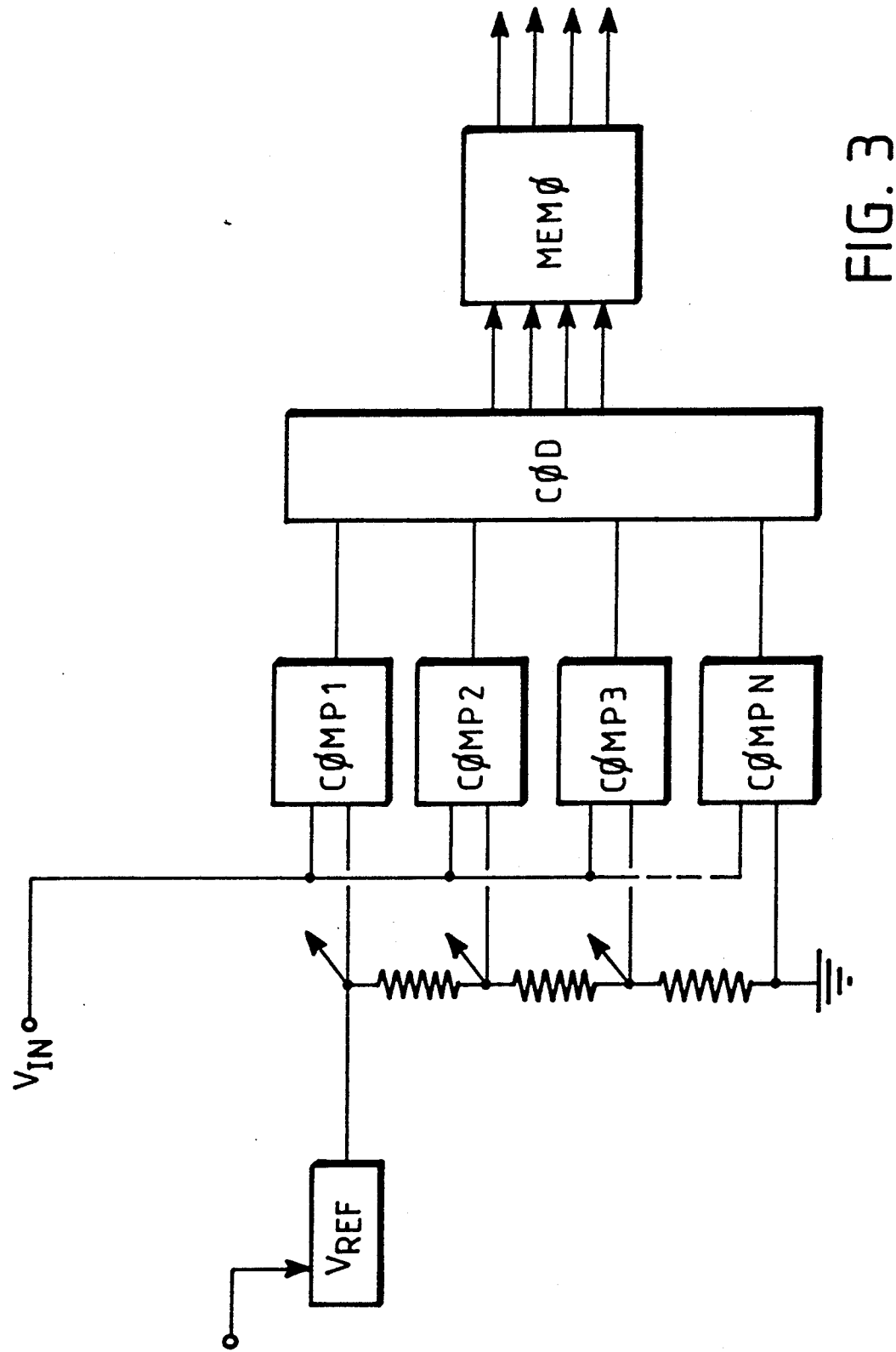
FIG. 3 shows an analog-to-digital converter circuit realized by means of comparators in accordance with the invention.

The analog-to-digital converter shown in FIG. 3 comprises several comparators (COMP 1,... COMPN) which are connected in parallel and each of which is provided with two inputs. The analog input voltage $V_{IN}$ to be converted is applied to an input of each comparator. The other input of each comparator receives a reference voltage which is obtained by application of a reference voltage to the terminals of the series connection of several resistances. When all resistances are equal, an arithmetical progression of reference voltages is obtained, the difference of the reference voltages being equal to $V_{REF}/2^n$, where n is the number of resolution bits for which the converter is designed. The various reference voltages have a rank number 1, 2, ... , i, $2^{n-1}$, $2^n$ and thus constitute a series according to $V_{REF}/2^n$, 2 $V_{REF}/2^n$, 3 $V_{REF}/2^n$ ... $V_{REF}$, the latter voltages being used only for indicating an overshoot bit. The outputs of the comparators are connected to the inputs of a logic encoding device (COD) which supplies an n-bit digital signal to the next output in an arbitrary code which may be, for example a Gray code. The structure of the encoding device depends on the required code, but is not described herein because the encoding device actually does not form a part of the present invention. A memory (MEMO) may be coupled to the output of the encoding device in order to save the information of the encoding device for at least a part of the clock period, thus enabling synchronization of the comparators. The clock signal required for the comparator and the memories is supplied by an external circuit. These circuits may be integrated on the same semiconductor substrate.

When the described comparator is realized by means of gallium arsenide Schottky transistors, the voltages $V_{IN}$, $V_{REF}$ are valued between ground and half the level of the positive supply voltage $V_{DD}$, that is to say in the order of 1 V.

The threshold voltages of the transistors are $V_T = 0.1$ V.

The d.c. supply voltages are:
for the first: $V_{DD} = 2$ V
for the second: ground
for the third $V_B = 0.5$ V, if any.

The lengths of the gate electrodes 1, the widths of the gate electrodes $L_g$ and the values of the resistances R are stated in the following table.

TABLE I

| Transistors | 1 in μm | Lg | Resistances | Value |
|---|---|---|---|---|
| $T_1$, $T_2$ $T_3,T_{13},T_{14}$ | 50 | 1 | $R_1,R_2,R'_1,R'_2$ | 2.7 kΩ |
| $T_{21},T_{22},T_{23},T_{24}$ | 30 | 0.7 | $R_{11}$, $R_{12}$ | 10 kΩ |
| $T_5,T_6,T_7,T_8$ | 20 | 0.7 | $R_{13}$, $R_{14}$ | 2.5 kΩ |
| $T_{11}$, $T_{12}$ | 10 | 0.7 | $R_{21}$, $R_{22}$ | 2 kΩ |

I claim:

1. An integrated circuit D-type master/slave flipflop comprising:
   a bistable master element connected between two supply voltage terminals, said master element having a first data input for receiving input data;
   control means having a control input for erasing or enabling writing into the master element under the control of a control signal;
   a bistable slave element connected between two supply voltage terminals and having a second data input connected to a data output of said master element, and
   means for controlling the slave element only via a data input signal at said second data input and for simultaneously writing into the slave element when said data input signal at said second data input reaches a predetermined voltage level.

2. An integrated circuit as claimed in claim 1, wherein the master element comprises two cross-coupled inverters, each of which is connected between the two supply voltage terminals and comprises a respective first load and a respective first driver transistor, the slave element comprising two cross-coupled inverters, each of which is connected between the two supply voltage terminals and comprises a respective second load and a respective second driver transistor, the control means comprising two control transistors, each of which has a main current path connected in parallel to a main current path of the respective first driver transistor and a control electrode for receiving the control signal, and wherein the controlling means comprises two coupling transistors, each of which has a main current path connected parallel to a main current path of the respective second driver transistor and a control electrode coupled to a respective data output terminal of the master element via a respective second data input.

3. An integrated circuit as claimed in claim 2, wherein each said respective first load comprises a series arrangement of a third and a fourth load with a node therebetween, each node between the respective third and fourth load forming said first data input and being connected to main current paths of respective further transistors, said further transistors constituting a differential pair for receiving input data.

4. An integrated circuit as claimed in claim 3, wherein one of the further transistors receives a reference signal at its respective control electrode.

5. An integrated circuit as claimed in claim 4, wherein said transistors are of the MESFET type.

6. An integrated circuit as claimed in claim 3, wherein said transistors are of the MESFET type.

7. An integrated circuit as claimed in claim 2, wherein said transistors are of the MESFET type.

8. An IC analog-to-digital converter comprising:
a plurality of D-type master/slave flip-flops having first data inputs coupled to an analog signal input terminal and having second inputs coupled to respective individual reference voltages, and
means for coupling an encoding device to outputs of said plurality of flip-flops, and wherein each flip-flop comprises:
a bistable master element comprising at least first and second cross-coupled transistors connected between two supply voltage terminals and having a respective one of said first data inputs for receiving input data,
control means coupled to said first and second transistors for switching the transistors in response to a control signal received by the control means,
a bistable slave element comprising at least third and fourth cross-coupled transistors connected between the two supply voltage terminals and having a second data input connected to a data output of its bistable master element, and
means for controlling the bistable slave element only via a data input signal at the second data input and for simultanesouly switching the bistable slave element when the data input signal at the second data input reaches a predetermined voltage level.

9. An IC analog-to-digital converter as claimed in claim 8 wherein each master element further comprises first and second loads connected in series with said first and second transistors, respectively, between the two supply voltage terminals,
each slave element further comprises third and fourth loads connected in series with said third and fourth transistors, respectively, between the two supply voltage terminals,
wherein the control means comprise first and second control transistors connected in parallel with the first and second transistors, respectively, and each of which control transistors has a control electrode for receiving the control signal, and
wherein the means for controlling the bistable slave element comprises first and second coupling transistors connected in parallel with said third and fourth transistors, respectively, each coupling transistor having a control electrode which constitutes said second data input.

10. An IC analog-to-digital converter as claimed in claim 9 wherein said first and second loads each comprise a series arrangement of first and second impedance elements with a node therebetween, which node forms a respective one of said first data inputs, and
first and second further transistors connected in series with at least respective ones of said first impedance elements and connected as a differential pair for receiving at one control electrode thereof said input data.

11. An IC voltage comparator comprising:
first and second transistors connected as a differential pair for comparing an analog input voltage at a control electrode of the first transistor with an analog reference voltage at a control electrode of the second transistor, and
a D-type master/slave flip-flop having first and second data inputs coupled to respective outputs of said first and second transistors, wherein each master/slave flip-flop comprises:
a bistable master element comprising third and fourth cross-coupled transistors connected between two supply voltage terminals and having respective control electrodes forming said first and second data inputs,
a bistable slave element comprising fifth and sixth cross-coupled transistors connected between the two supply voltage terminals and having third and fourth data inputs coupled to respective data outputs of the third and fourth transistors,
control means coupled to said third and fourth transistors for controlling said transistors in response to a control signal received by the control means, and
means for controlling the bistable slave element only via a data input signal at the third and fourth data inputs and for simultaneously switching the bistable slave element when the data input signal at the third and fourth data inputs reaches a predetermined voltage level.

12. A D-type master/slave flip-flop comprising:
a bistable master element including first and second cross-coupled transistors coupled to a source of supply voltage and having respective first data inputs for receiving input data,
control means coupled to said first and second transistors for controlling said transistors in response to a control signal received at a control input of the control means, and
a bistable slave element including third and fourth cross-coupled transistors coupled to said source of supply voltage and having respective second data inputs coupled to respective data outputs of respective ones of said first and second transistors, wherein said third and fourth transistors are controlled at said second data inputs and independently of said control signal.

* * * * *